(12) United States Patent
Loubet et al.

(10) Patent No.: US 8,987,082 B2
(45) Date of Patent: Mar. 24, 2015

(54) METHOD OF MAKING A SEMICONDUCTOR DEVICE USING SACRIFICIAL FINS

(71) Applicant: STMicroelectronics, Inc., Coppell, TX (US)

(72) Inventors: Nicolas Loubet, Guilderland, NY (US); Prasanna Khare, Schenectady, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/906,758

(22) Filed: May 31, 2013

(65) Prior Publication Data

US 2014/0357029 A1  Dec. 4, 2014

(51) Int. Cl.
*H01L 21/8238* (2006.01)
*H01L 21/8234* (2006.01)

(52) U.S. Cl.
CPC  *H01L 21/823481* (2013.01); *H01L 21/823431* (2013.01); *H01L 21/823821* (2013.01)
USPC .......................................... 438/212; 438/424

(58) Field of Classification Search
USPC .................................. 438/212, 424, 156, 268
See application file for complete search history.

(56) References Cited

U.S. PATENT DOCUMENTS

| | | | |
|---|---|---|---|
| 7,247,578 B2 * | 7/2007 | Brask ............................. | 438/753 |
| 7,268,058 B2 | 9/2007 | Chau et al. | |
| 7,288,802 B2 | 10/2007 | Anderson et al. | |
| 8,110,458 B2 | 2/2012 | Jin et al. | |
| 8,310,013 B2 | 11/2012 | Lin et al. | |
| 8,445,334 B1 | 5/2013 | Basker et al. | |
| 8,497,171 B1 * | 7/2013 | Wu et al. ........................ | 438/218 |
| 2004/0036127 A1 | 2/2004 | Chau et al. | |
| 2006/0024874 A1 | 2/2006 | Yun et al. | |
| 2006/0076625 A1 * | 4/2006 | Lee et al. ....................... | 257/353 |
| 2008/0135949 A1 | 6/2008 | Lo et al. | |
| 2008/0169472 A1 | 7/2008 | Bryant et al. | |
| 2008/0265280 A1 | 10/2008 | Currie | |
| 2010/0237424 A1 * | 9/2010 | Cheng et al. ................... | 257/369 |
| 2012/0018810 A1 * | 1/2012 | Chambers et al. ............. | 257/369 |
| 2012/0138886 A1 | 6/2012 | Kuhn et al. | |
| 2012/0146112 A1 | 6/2012 | Cheng et al. | |
| 2012/0252174 A1 | 10/2012 | Dutartre et al. | |
| 2013/0052801 A1 | 2/2013 | Berliner et al. | |

* cited by examiner

*Primary Examiner* — Reema Patel
(74) *Attorney, Agent, or Firm* — Allen, Dyer, Doppelt, Milbrath & Gilchrist, P.A.

(57) ABSTRACT

A method of making a semiconductor device includes forming a sacrificial layer above a semiconductor layer. Portions of the sacrificial layer are selectively removed to define a first set of spaced apart sacrificial fins over a first region of the semiconductor layer, and a second set of spaced apart sacrificial fins over a second region of the semiconductor layer. An isolation trench is formed in the semiconductor layer between the first and second regions. The isolation trench and spaces are filled with a dielectric material. The first and second sets of sacrificial fins are removed to define respective first and second sets of fin openings. The first set of fin openings is filled to define a first set of semiconductor fins for a first conductivity-type transistor, and the second set of fin openings is filled to define a second set of semiconductor fins for a second conductivity-type transistor.

23 Claims, 11 Drawing Sheets

US 8,987,082 B2

METHOD OF MAKING A SEMICONDUCTOR DEVICE USING SACRIFICIAL FINS

FIELD OF THE INVENTION

The present invention relates to a method of making electronic devices, and more particularly, to a method of making semiconductor devices.

BACKGROUND

Semiconductor device technologies continue to evolve, providing higher chip density and operating frequencies. Fin-type field-effect transistors (FinFETs) are one type of transistor technology that is currently used to help provide desired device scaling while maintaining appropriate power consumption budgets.

A fin-type field effect transistor is a transistor that is formed with a fin of material. A fin is a relatively narrow width and relatively tall height structure that protrudes from the top surface of a semiconductor layer. The fin width is intentionally kept small to limit the short channel effect.

In a conventional FinFET, a gate conductor is positioned on the top surface of the semiconductor layer and over a portion of the fin. The gate conductor runs parallel to the top of the semiconductor layer and is perpendicular to the fin length such that the gate conductor intersects a portion of the fin. An insulator (e.g., gate oxide) separates the gate conductor from the fin. Further, the region of the fin that is positioned below the gate conductor defines a semiconductor channel region. The FinFET structure can include multiple fins, in which case the gate conductor would wrap around, as well as fill in, the space between these fins.

A semiconductor device may include different conductivity-type fin-type transistors, such as NFETs and PFETs. U.S. published patent application no. 2012/0138886 discloses an epitaxial stack of fins comprising a combination of silicon-germanium and silicon. After the fins have been formed, trenches are formed in the semiconductor layer, such as during a shallow trench isolation (STI) process.

As part of the STI process, a high temperature annealing process is typically performed to densify a dielectric material formed within the trenches so as to have a better dielectric property. However, the thermal budget associated with the annealing process is typically within a temperature range of 800-1100° C. for about 30 minutes. Unfortunately, this thermal budget may cause the fin to diffuse into the semiconductor layer, particularly when the fin includes silicon-germanium, for example.

SUMMARY

A method of making a semiconductor device comprises forming a sacrificial layer above a semiconductor layer, with the semiconductor layer comprising a first region for a first conductivity-type transistor and a second region laterally adjacent the first region for a second conductivity-type transistor. Portions of the sacrificial layer may be selectively removed to define a first set of spaced apart sacrificial fins over the first region, and a second set of spaced apart sacrificial fins over the second region.

An isolation trench may be formed in the semiconductor layer between the first and second regions. The isolation trench and spaces between adjacent ones of the first and second sets of spaced apart sacrificial fins may be filled with a dielectric material. The first and second sets of sacrificial fins may be removed to define respective first and second sets of fin openings. The first set of fin openings may be filled to define a first set of semiconductor fins for the first conductivity-type transistor, and the second set of fin openings may be filled to define a second set of semiconductor fins for the second conductivity-type transistor.

The first and second sets of sacrificial fins advantageously serve as place holders for the first and second sets of semiconductor fins while the isolation trench is formed. The sacrificial fins may comprise polysilicon, for example, which is very stable to high temperatures. Consequently, the sacrificial fins do not diffuse into the underlying semiconductor layer when exposed to a high temperature annealing process associated with forming the isolation trench. After formation of the isolation trench, the first and second sets of sacrificial fins are advantageously replaced with the first and second sets of semiconductor fins.

Filling the first set of fin openings may comprise epitaxially growing a silicon-germanium bottom region and a silicon top region thereover. Similarly, filling the second set of fin openings may comprise epitaxially growing a silicon bottom region and a silicon-germanium region thereover.

In particular, since the silicon-germanium is not exposed to the high temperature annealing process associated with forming the isolation trench, the silicon-germanium will not diffuse into the underlying semiconductor layer. Consequently, filling the isolation trench and spaces between adjacent ones of the first and second sets of spaced apart fin openings with the dielectric material has a higher thermal budget than a thermal budget for filling the first and second sets of fin openings.

More particularly, removing the first and second sets of sacrificial fins and filling the first and second sets of fin openings may comprise masking the second set of sacrificial fins while removing the first set of sacrificial fins and filling the first set of fin openings, and may comprise masking the first set of semiconductor fins while removing the second set of sacrificial fins and filling the second set of fin openings.

The method may further comprise forming a dielectric layer between the semiconductor layer and the sacrificial layer. The method may further comprise selectively removing underlying portions of the dielectric layer aligned with the first and second sets of sacrificial fins when removing the first and second sets of sacrificial fins to thereby expose respective underlying surfaces of the first and second regions.

The semiconductor layer may comprise silicon, the sacrificial layer may comprise polysilicon, and the dielectric material may comprise an oxide.

DETAILED DESCRIPTION OF THE PREFERRED EMBODIMENTS

The present embodiments will now be described more fully hereinafter with reference to the accompanying drawings, in which preferred embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

A method of making a semiconductor device will now be discussed in reference to the flowchart 100 in FIG. 1 and to the process flow illustrated in FIGS. 2-11. As will be discussed in greater detail below, a sacrificial layer is used to form sacrificial fins on a semiconductor layer for fin-type field effect transistors (FinFETs). After the sacrificial fins are formed, isolation trenches are then formed in the semiconductor layer. After formation of the isolation trenches, then the sacrificial fins are replaced with semiconductor fins. Since a higher thermal budget is used to form the isolation trenches as compared to the thermal budget used to form the semiconductor fins, the semiconductor fins, which define the channels of the FinFETs, do not diffuse into the underlying semiconductor layer.

Figure 1:
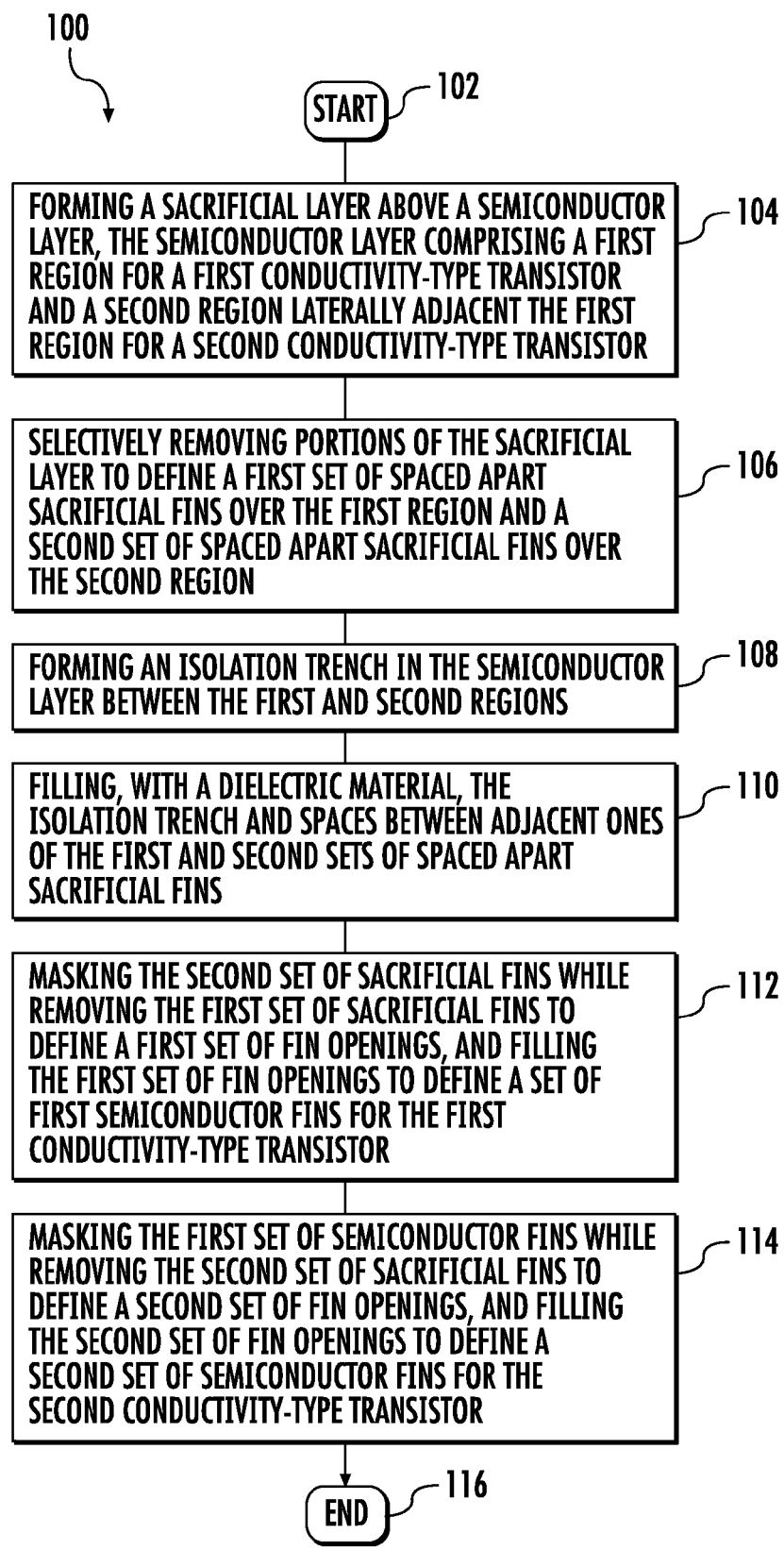
FIG. 1 is a flowchart illustrating a method for making a semiconductor device in accordance with the present embodiment.
Figure 2:
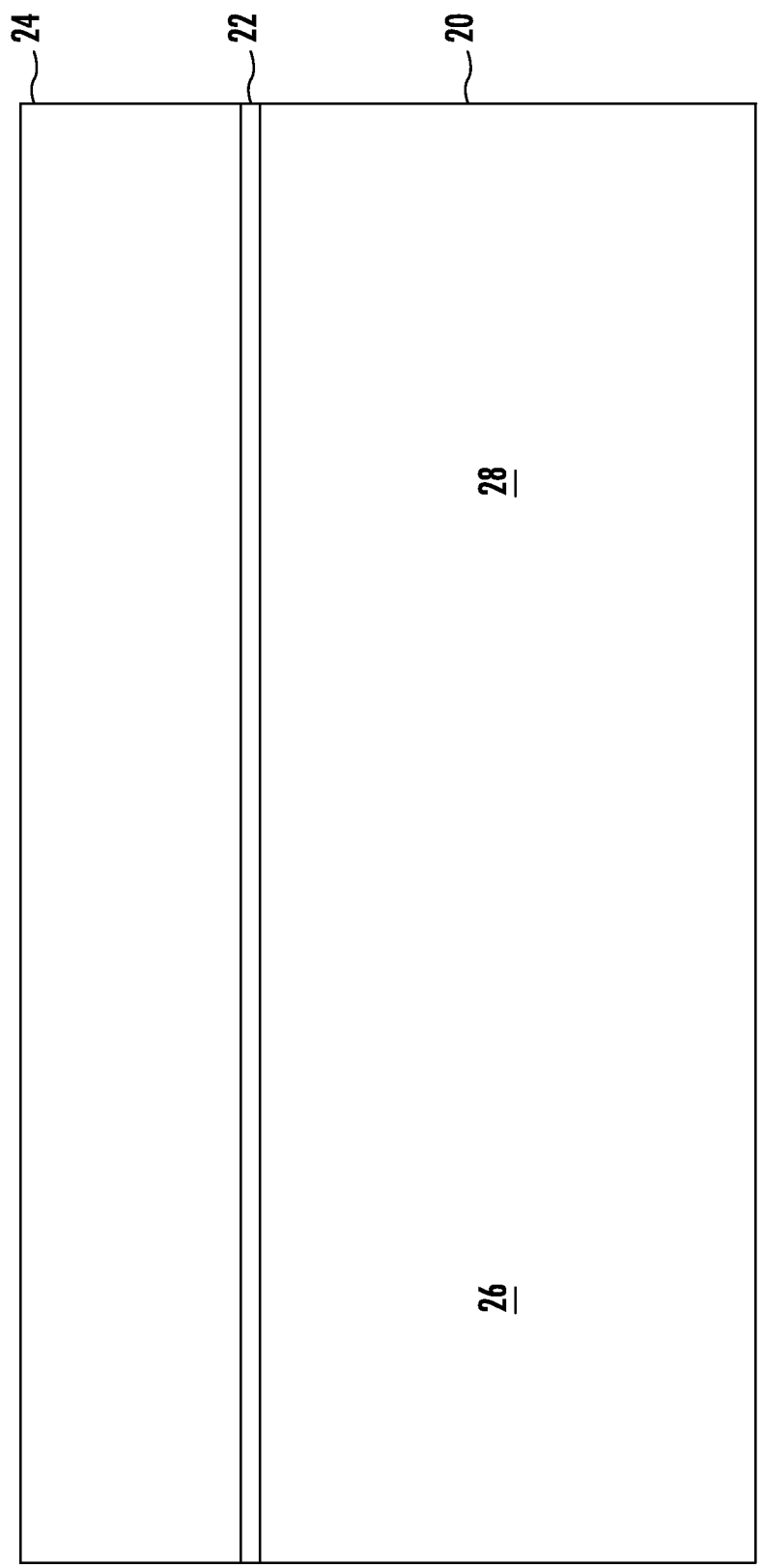
FIG. 2 is a schematic cross-sectional view of a sacrificial layer above a semiconductor layer in accordance with the present embodiment.

Referring initially to the flowchart 100 in FIG. 1 and to the process flow illustrated in FIG. 2, the method includes, from the start (Block 102), forming a sacrificial layer 24 above a semiconductor layer 20 at Block 104. The illustrated process flow includes forming a dielectric layer 22 on the semiconductor layer 20 and forming the sacrificial layer 24 on the semiconductor layer. As an example, the semiconductor layer 20 is silicon, the dielectric material 22 is a silicon dioxide or silicon oxide, and the sacrificial layer 24 is polysilicon.

The semiconductor layer 20 includes a first region 26 for a first conductivity-type transistor and a second region 28 laterally adjacent the first region for a second conductivity-type transistor. The first region 26 corresponds to an NMOS semiconductor for an NFET device, whereas the second region 28 corresponds to a PMOS semiconductor for a PFET device. Doping of the semiconductor layer 20 may be performed before the dielectric layer 22 is formed, or alternatively, later on in the process flow, as will be discussed below.

Figure 3:
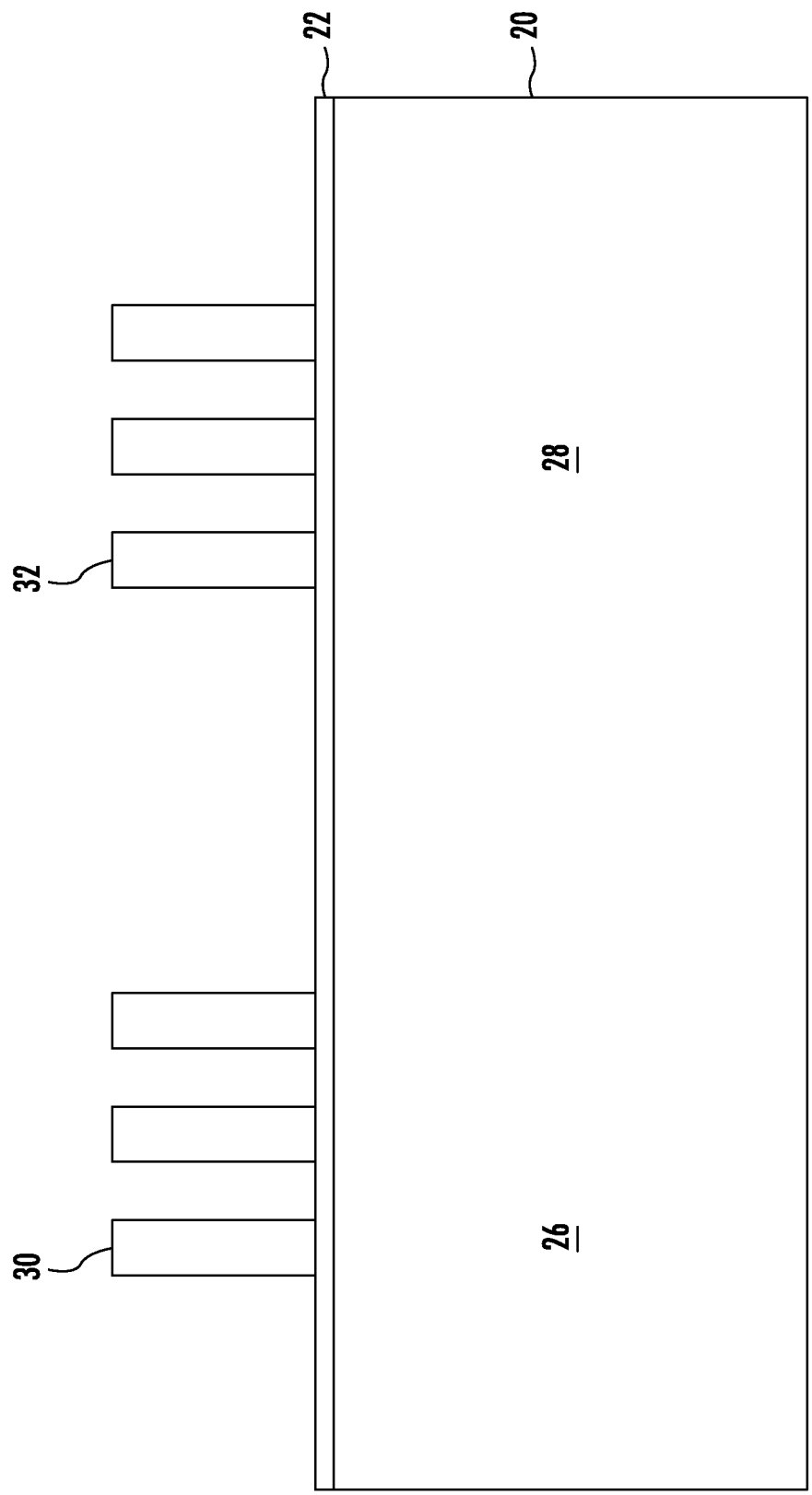
FIG. 3 is a schematic cross-sectional view of the sacrificial layer shown in FIG. 2 with portions of the sacrificial layer selectively removed to define a first set of spaced apart sacrificial fins and a second set of spaced apart sacrificial fins.

The method further includes selectively removing portions of the sacrificial layer 24 to define a first set of spaced apart sacrificial fins 30 over the first region 26 and a second set of spaced apart sacrificial fins 32 over the second region 28 at Block 106. The sacrificial fins 30, 32 are formed by selectively removing portions of the sacrificial layer 24, as illustrated in FIG. 3. A first set of spaced apart sacrificial fins 30 is formed over the first region 26 in the semiconductor layer 20. A second first set of spaced apart sacrificial fins 32 is formed over the second region 28 in the semiconductor layer 20. The first and second sets of spaced apart sacrificial fins 30, 32 are temporary, and are eventually replaced with semiconductor fins after formation of the isolation trenches 40.

Figure 4:
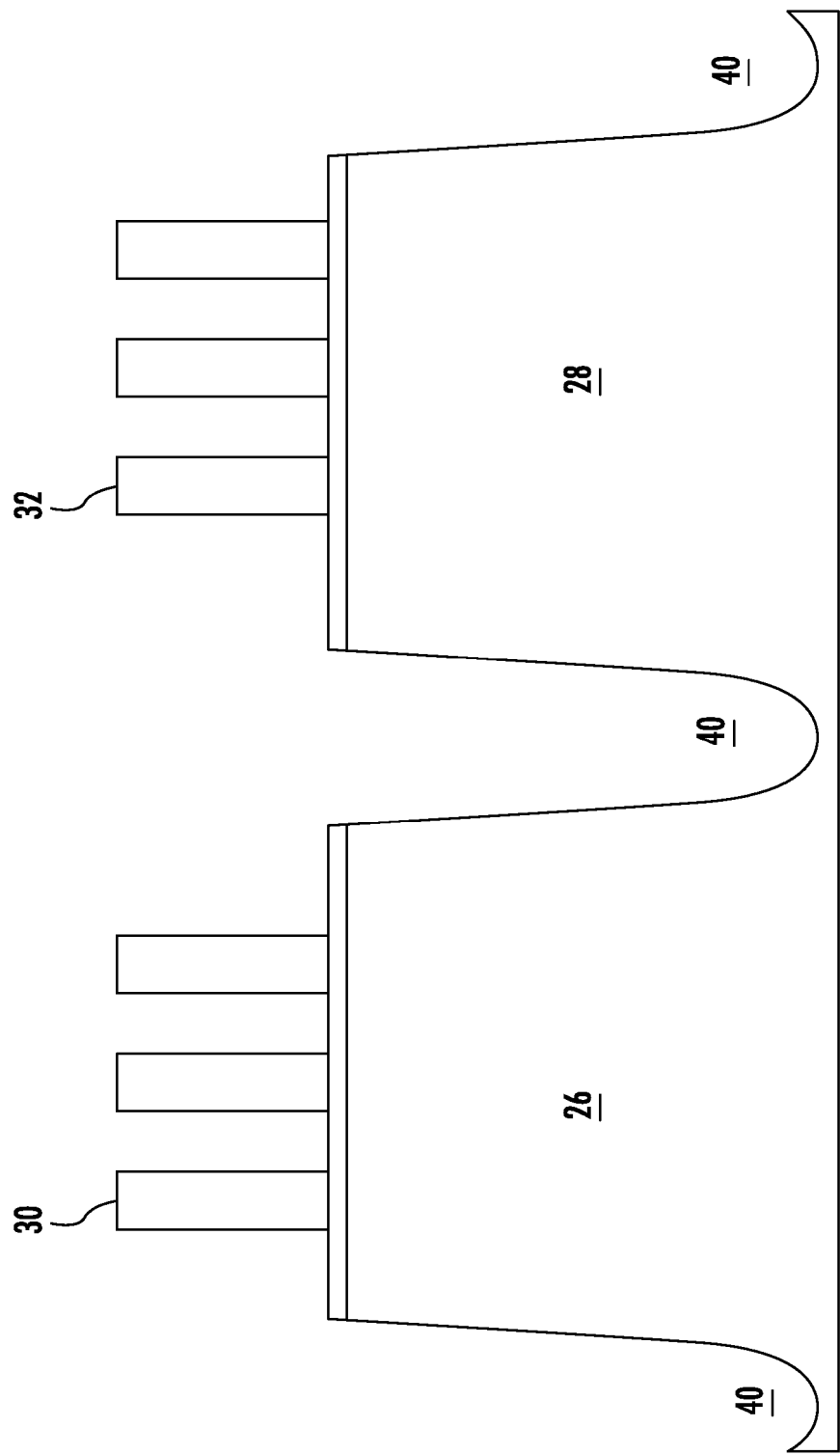
FIG. 4 is a schematic cross-sectional view of the first and second sets of spaced apart sacrificial fins shown in FIG. 3 with an isolation trench formed therebetween in the semiconductor layer.

An isolation trench 40 is formed at Block 108 in the semiconductor layer 20 between the first and second regions 26, 28, as illustrated in FIG. 4. Each isolation trench 40 is also known as shallow trench isolation (STI). A dielectric material 22, such as silicon dioxide, is formed in the isolation trenches 40 using a high aspect ratio process (HARP), as readily appreciated by those skilled in the art. A high temperature annealing process is then performed to densify the silicon dioxide for a better dielectric property. The thermal budget for performing this annealing process is about 800 to 1100° C. for about 30 minutes.

At this point in the process flow, the semiconductor fins have not been formed. The first and second sets of spaced apart sacrificial fins 30, 32 are subjected to the high temperature annealing process instead of the semiconductor fins. The polysilicon making up the first and second sets of sacrificial fins 30, 32 is very stable when exposed to high temperature.

If the semiconductor fins had already been formed instead of the first and second sets of spaced apart sacrificial fins 30, 32, then the semiconductor fins would diffuse into the underlying semiconductor layer 20. Consequently, the thermal budget associated with forming the semiconductor fins is considerably less than the thermal budget associated with the high temperature annealing process of the isolation trenches 40.

Figure 5:
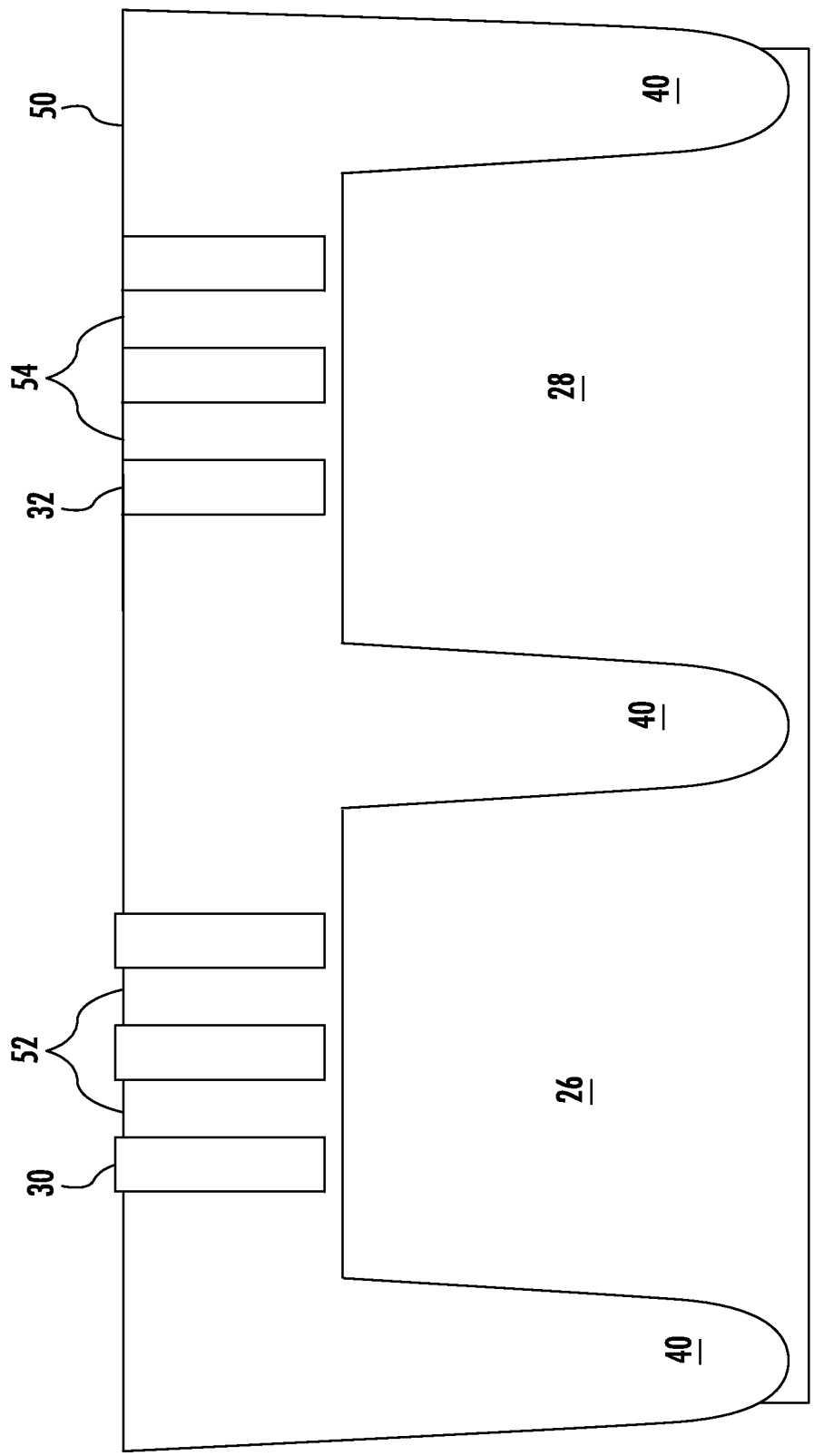
FIG. 5 is a schematic cross-sectional view of spaces between adjacent ones of the first and second sets of spaced apart sacrificial fins and the isolation trench shown in FIG. 4 filled with a dielectric material.

The method further comprises at Block 110 filling, with a dielectric material 50, the isolation trench and spaces 52, 54 between adjacent ones of the first and second sets of spaced apart sacrificial fins 30, 32, as illustrated in FIG. 5. Chemical mechanical polishing (CMP) is used to form a planar upper surface so that the dielectric material 50 and an upper surface of the first and second sets of spaced apart sacrificial fins 30, 32 are co-planar.

Figure 6:
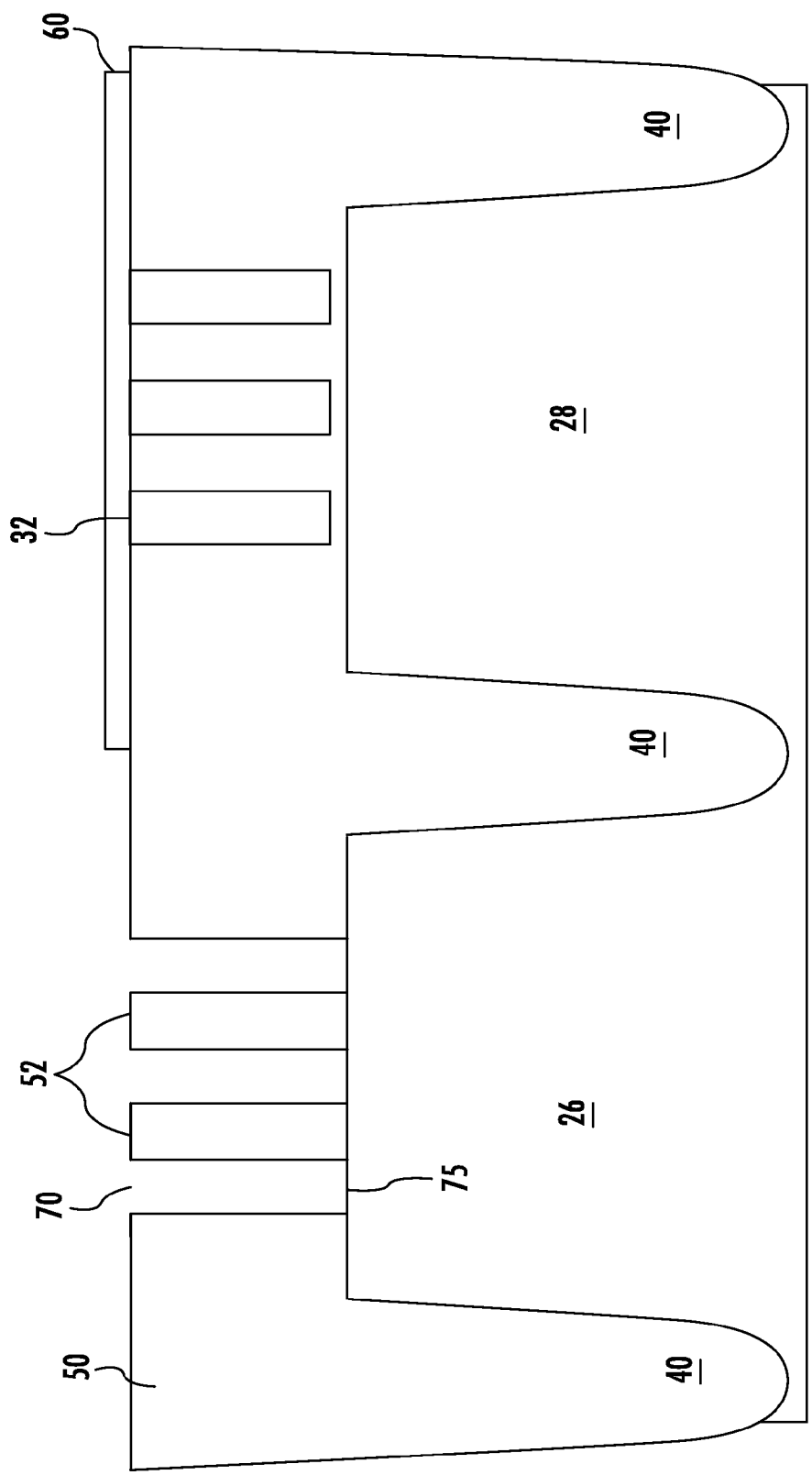
FIG. 6 is a schematic cross-sectional view of the second set of spaced apart sacrificial fins as shown in FIG. 5 with a protective mask thereover and with the first set of sacrificial fins removed to define a first set of fin openings.
Figure 7:
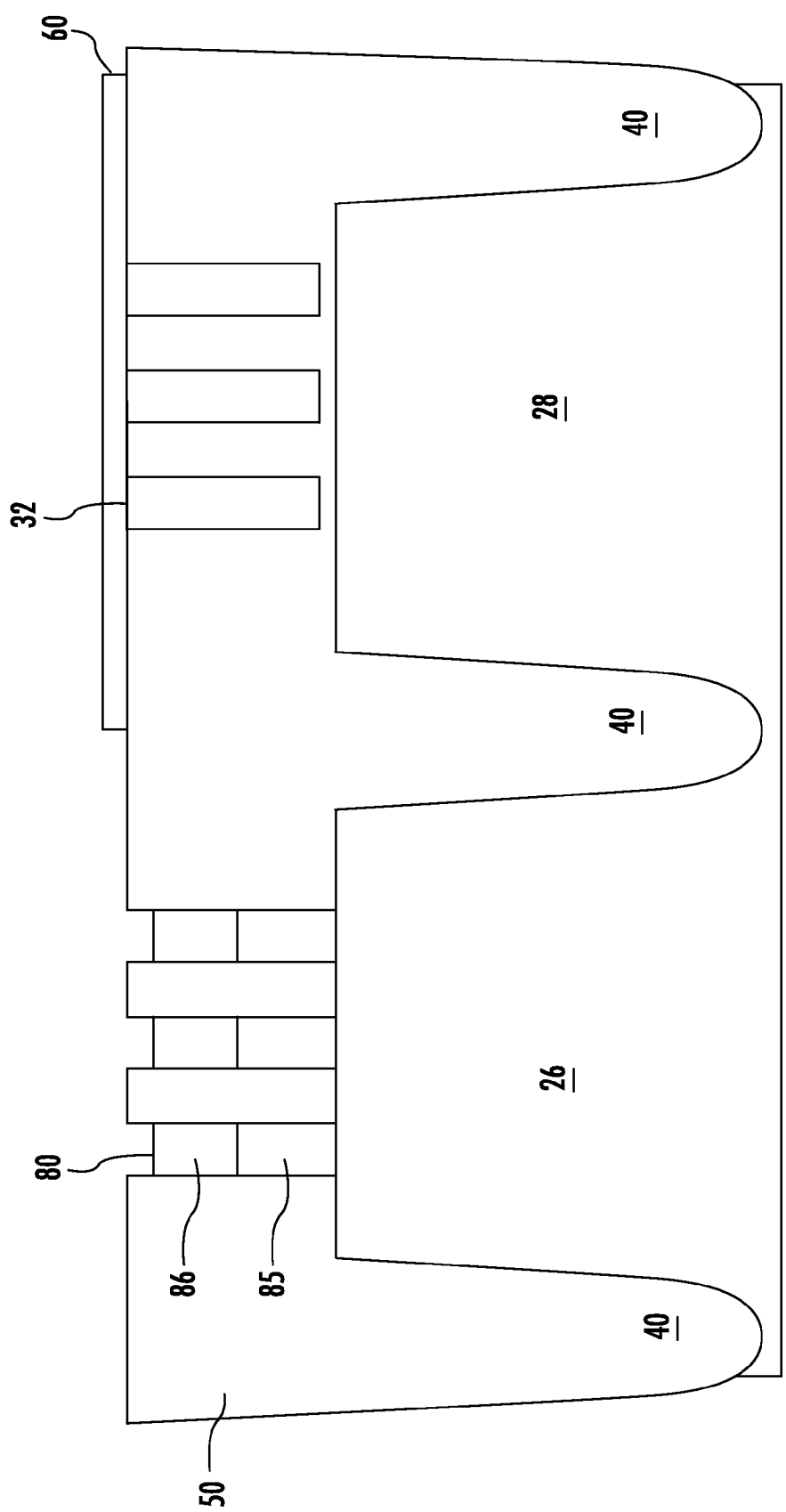
FIG. 7 is a schematic cross-sectional view of the first set of fin openings shown in FIG. 6 filled to define a first set of semiconductor fins.

The second set of sacrificial fins 32 is masked at Block 112 while removing the first set of sacrificial fins 30 to define a first set of fin openings 70, and the first set of fin openings is filled to define a set of first semiconductor fins 80 for the first conductivity-type transistor, as illustrated in FIGS. 6 and 7.

A masking layer 60 is used to protect the second set of sacrificial fins 32 while the first set of sacrificial fins 30 is removed using photoresist to define the first set of fin openings 70. Silicon nitride may be used to form the masking layer 60, for example. In addition to removing the first set of sacrificial fins 30, the underlying dielectric material 50 aligned with the first set of sacrificial fins 30 is also removed to thereby expose underlying surfaces 75 of the first region 26.

The first set of fin openings 70 is filled to define the first set of semiconductor fins 80 for the first conductivity-type transistor. The first set of semiconductor fins 80 is epitaxially grown. In the illustrated embodiment, defining the first set of semiconductor fins 80 includes epitaxially growing a silicon-germanium layer 85 and then a silicon layer 86 on the silicon-germanium layer. In other embodiments, only silicon is used to define the first set of semiconductor fins 80.

Figure 8:
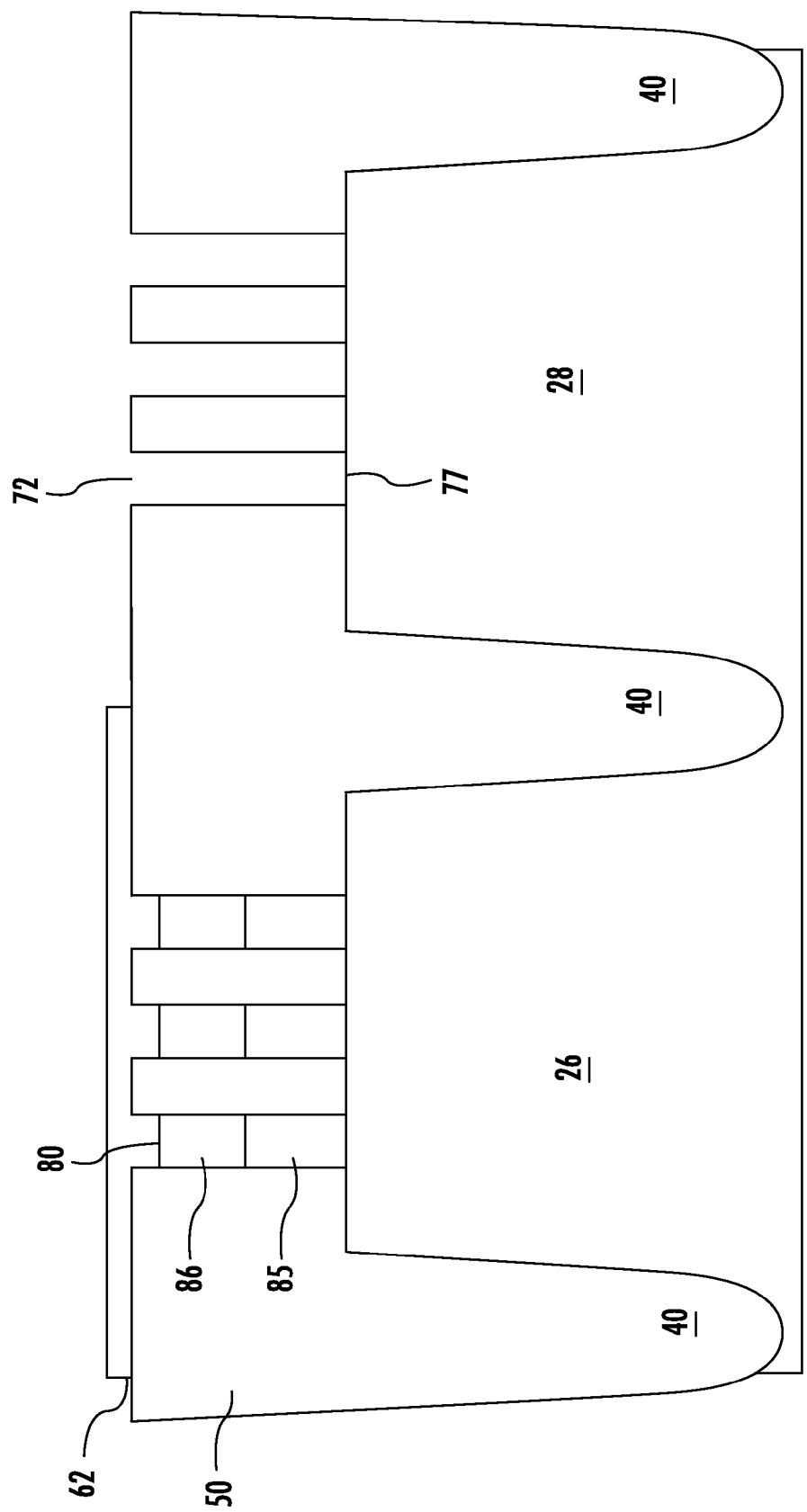
FIG. 8 is a schematic cross-sectional view of the first set of semiconductor fins as shown in FIG. 7 with a protective mask thereover and with the second set of sacrificial fins removed to define a second set of fin openings.
Figure 9:
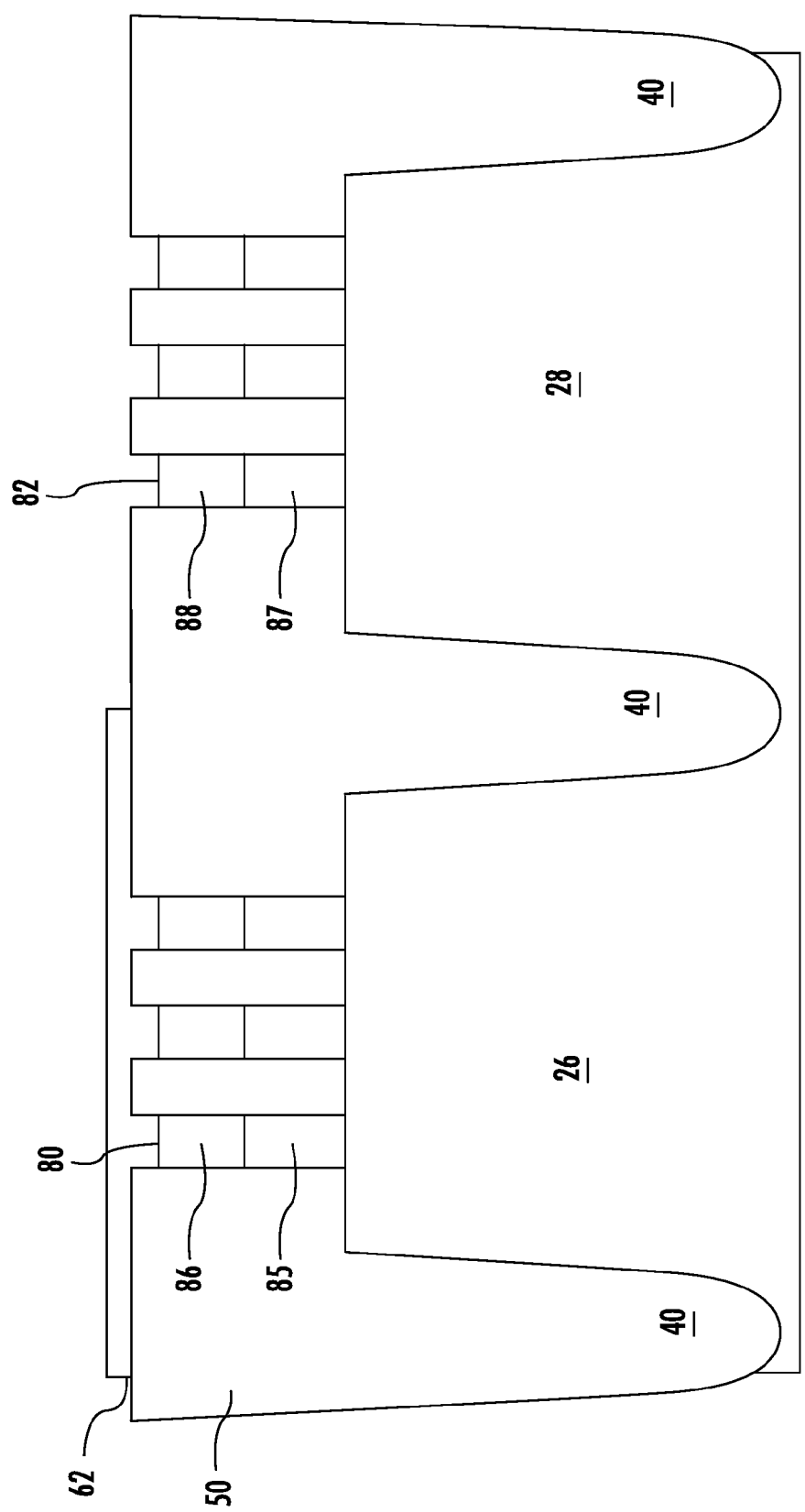
FIG. 9 is a schematic cross-sectional view of the second set of fin openings shown in FIG. 9 filled to define a second set of semiconductor fins.

The first set of semiconductor fins 80 is masked at Block 114 while removing the second set of sacrificial fins to define a second set of openings 72, and the second set of fin openings is filled to define a second set of semiconductor fins 80 for the second conductivity-type transistor, as illustrated in FIGS. 8 and 9.

A masking layer 62 is now used to protect the first set of semiconductor fins 80 while the second set of sacrificial fins 32 is removed using photoresist to define a second set of fin openings 72. Silicon nitride may be used to form the masking layer 62, for example. In addition to removing the second set of sacrificial fins 32, the underlying dielectric material 50 aligned with the second set of sacrificial fins 32 is also removed to thereby expose underlying surfaces 77 of the second region 28.

The second set of fin openings 72 is filled to define a second set of semiconductor fins 82 for the second conductivity-type transistor. The second set of semiconductor fins 82 is epitaxially grown. In the illustrated embodiment, defining the second set of semiconductor fins 82 includes epitaxially growing a silicon layer 87 and then a silicon-germanium layer 88 on the silicon layer. In other embodiments, only silicon-germanium is used to define the second set of semiconductor fins 82. By way of example, for epitaxial growth of silicon, a temperature of about 600° C. may be used, and for epitaxial growth of silicon-germanium, a temperature of about 550° C. may be used.

As noted above, the first and second sets of sacrificial fins 30, 32 advantageously serve as place holders for the first and second sets of semiconductor fins 80, 82 while the isolation trenches 40 are formed. The sacrificial fins are very stable to high temperatures.

In the illustrated embodiment, since the silicon-germanium layers 85, 88 in the semiconductor fins 80, 82 are not exposed to the high temperature annealing process associated with forming the isolation trenches 40, the silicon-germanium will not diffuse into the underlying semiconductor layer 20. In other embodiments, the fins may comprise silicon-carbon, where the carbon would also diffuse into the underlying semiconductor layer 20 when exposed to the high temperature annealing process.

Figure 10:
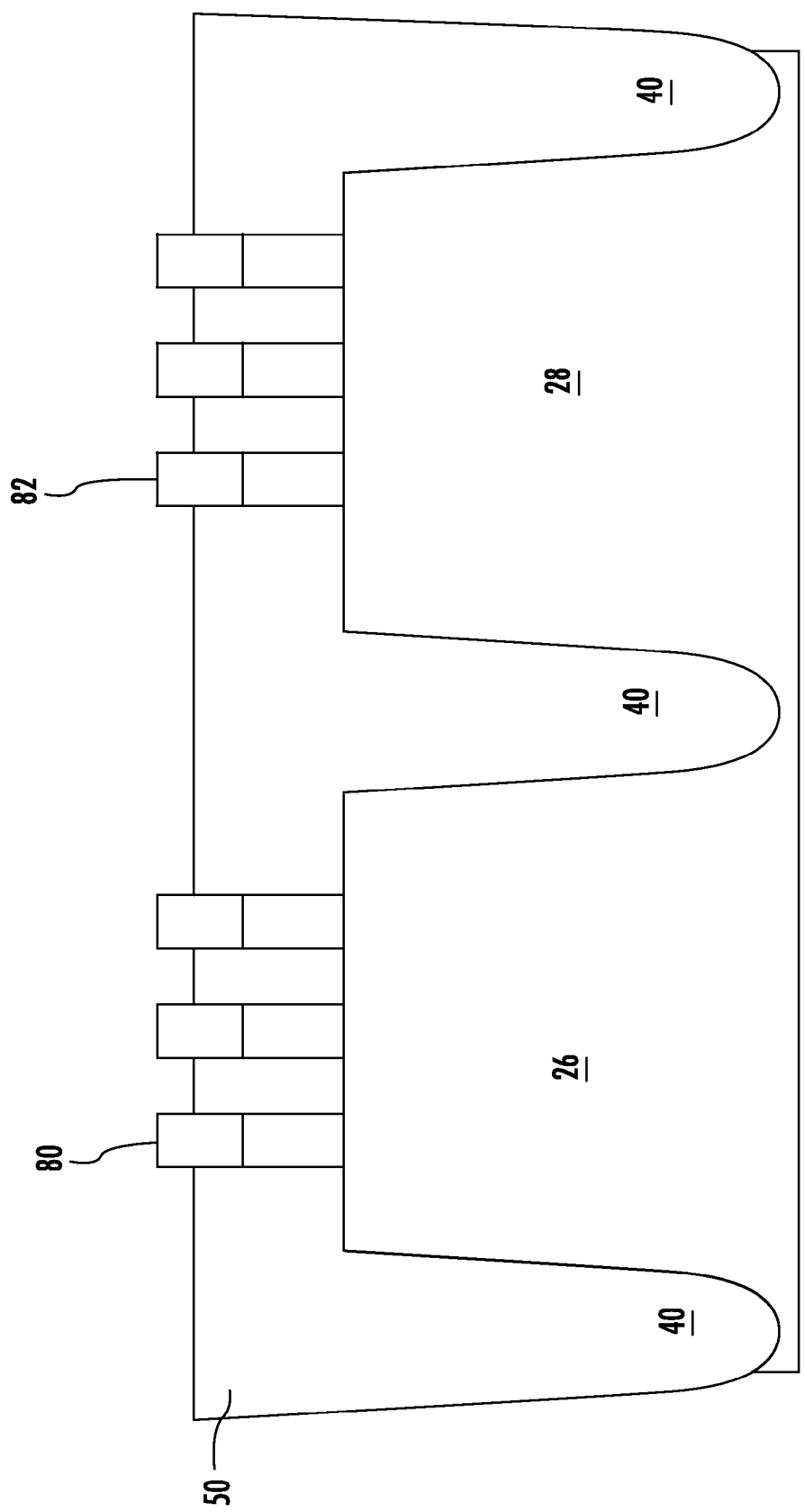
FIG. 10 is a schematic cross-sectional view of the first and second sets of semiconductor fins shown in FIG. 9 with exposed upper portions.
Figure 11:
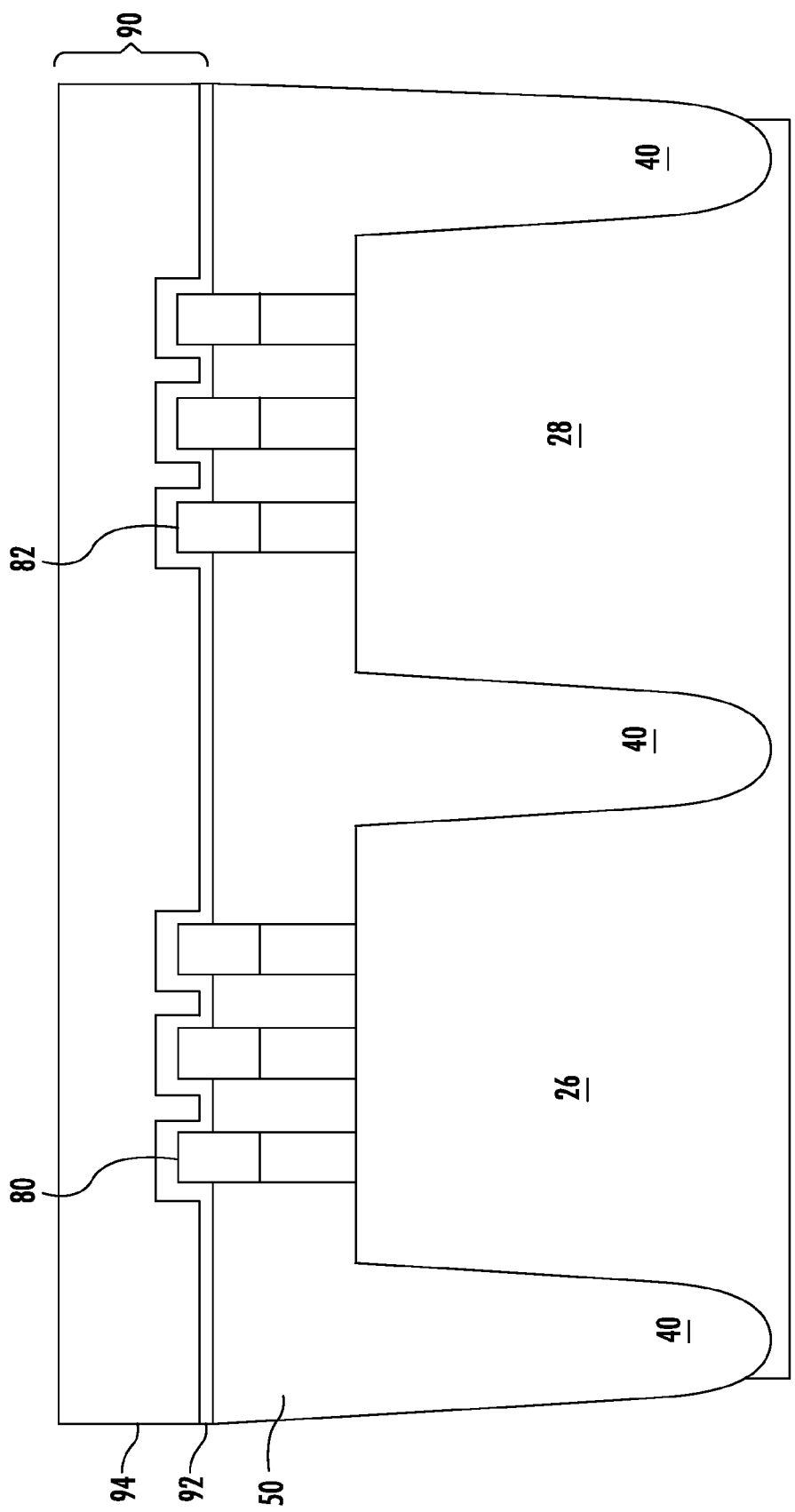
FIG. 11 is a schematic cross-sectional view of the first and second sets of semiconductor fins shown in FIG. 10 with a gate on the exposed upper portions thereof.

Next in the process flow, the masking layer 62 is removed, and an upper portion of the dielectric material 50 is removed so as to expose upper portions of the first and second sets of semiconductor fins 80, 82, as illustrated in FIG. 10. A gate 90 is formed around the exposed upper portions of the first and second sets of semiconductor fins 80, 82, as illustrated in FIG. 10. The gate 90 includes a polysilicon layer 94 on a dielectric layer 92. The method ends at Block 114.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

That which is claimed is:

1. A method of making a semiconductor device comprising:
    forming a sacrificial layer above a semiconductor layer, the semiconductor layer comprising a first region for a first conductivity-type transistor and a second region laterally adjacent the first region for a second conductivity-type transistor;
    selectively removing portions of the sacrificial layer to define a first set of spaced apart sacrificial fins over the first region, and a second set of spaced apart sacrificial fins over the second region;
    forming an isolation trench in the semiconductor layer between the first and second regions;
    filling, with a dielectric material, the isolation trench and spaces between adjacent ones of the first and second sets of spaced apart sacrificial fins and annealing to densify the dielectric material;
    removing the first and second sets of sacrificial fins to define respective first and second sets of fin openings; and
    filling the first set of fin openings to define a first set of semiconductor fins for the first conductivity-type transistor, and filling the second set of fin openings to define a second set of semiconductor fins for the second conductivity-type transistor.

2. The method according to claim 1 wherein filling, with the dielectric material, the isolation trench and spaces between adjacent ones of the first and second sets of spaced apart fin openings has a higher thermal budget than a thermal budget for filling the first and second sets of fin openings.

3. The method according to claim 1 wherein removing the first and second sets of sacrificial fins and filling the first and second sets of fin openings comprises:
    masking the second set of sacrificial fins while removing the first set of sacrificial fins and filling the first set of fin openings; and
    masking the first set of semiconductor fins while removing the second set of sacrificial fins and filling the second set of fin openings.

4. The method according to claim 1 further comprising forming a dielectric layer between the semiconductor layer and the sacrificial layer.

5. The method according to claim 4 further comprising selectively removing underlying portions of the dielectric layer aligned with the first and second sets of sacrificial fins when removing the first and second sets of sacrificial fins to thereby expose respective underlying surfaces of the first and second regions.

6. The method according to claim 1 wherein filling the first set of fin openings comprises epitaxially growing a silicon-germanium bottom region and a silicon top region thereover; and wherein filling the second set of fin openings comprises epitaxially growing a silicon bottom region and a silicon-germanium region thereover.

7. The method according to claim 1 wherein the semiconductor layer comprises silicon; and wherein the sacrificial layer comprises polysilicon.

8. The method according to claim 1 wherein the dielectric material comprises an oxide.

9. A method of making a semiconductor device comprising:
    forming a sacrificial layer above a semiconductor layer, the semiconductor layer comprising a first region for a first conductivity-type transistor and a second region laterally adjacent the first region for a second conductivity-type transistor;
    selectively removing portions of the sacrificial layer to define a first set of spaced apart sacrificial fins over the first region, and a second set of spaced apart sacrificial fins over the second region;
    forming an isolation trench in the semiconductor layer between the first and second regions;
    filling, with a dielectric material, the isolation trench and spaces between adjacent ones of the first and second sets of spaced apart sacrificial fins and annealing to densify the dielectric material;

masking the second set of sacrificial fins while removing the first set of sacrificial fins, and filling the first set of fin openings to define a set of first semiconductor fins for the first conductivity-type transistor; and masking the first set of semiconductor fins while removing the second set of sacrificial fins, and filling the second set of fin openings to define a second set of semiconductor fins for the second conductivity-type transistor.

10. The method according to claim 9 wherein filling, with the dielectric material, the isolation trench and spaces between adjacent ones of the first second sets of spaced apart fin openings has a higher thermal budget than a thermal budget for filling the first and second sets of fin openings.

11. The method according to claim 9 further comprising forming a dielectric layer between the semiconductor layer and the sacrificial layer.

12. The method according to claim 11 further comprising selectively removing underlying portions of the dielectric layer aligned with the first set of sacrificial fins when removing the first set of sacrificial fins to thereby expose underlying surfaces of the first region.

13. The method according to claim 11 further comprising selectively removing underlying portions of the dielectric layer aligned with the second set of sacrificial fins when removing the second set of sacrificial fins to thereby expose underlying surfaces of the second region.

14. The method according to claim 9 wherein filling the first set of fin openings comprises epitaxially growing a silicon-germanium bottom region and a silicon top region thereover.

15. The method according to claim 9 wherein filling the second set of fin openings comprises epitaxially growing a silicon bottom region and a silicon-germanium region thereover.

16. The method according to claim 9 wherein the semiconductor layer comprises silicon; and wherein the sacrificial layer comprises polysilicon.

17. The method according to claim 9 wherein the dielectric material comprises an oxide.

18. A method of making a semiconductor device comprising:

forming a polysilicon sacrificial layer above a silicon layer, the silicon layer comprising a first region for a first conductivity-type transistor and a second region laterally adjacent the first region for a second conductivity-type transistor;

selectively removing portions of the polysilicon sacrificial layer to define a first set of spaced apart polysilicon sacrificial fins over the first region and a second set of spaced apart polysilicon sacrificial fins over the second region;

forming an isolation trench in the semiconductor layer between the first and second regions;

filling, with an oxide material, the isolation trench and spaces between adjacent ones of the first and second sets of spaced apart sacrificial fins and annealing to densify the oxide material;

removing the first and second sets of polysilicon sacrificial fins to define respective first and second sets of fin openings; and filling the first set of fin openings to define a first set of semiconductor fins for the first conductivity-type transistor, and filling the second set of fin openings to define a second set of semiconductor fins for the second conductivity-type transistor.

19. The method according to claim 18 wherein filling, with the oxide material, the isolation trench and spaces between adjacent ones of the first and second sets of spaced apart fin openings has a higher thermal budget than a thermal budget for filling the first and second sets of fin openings.

20. The method according to claim 18 wherein removing the first and second sets of polysilicon sacrificial fins and filling the first and second sets of fin openings comprises:

masking the second set of polysilicon sacrificial fins while removing the first set of polysilicon sacrificial fins and filling the first set of fin openings; and masking the first set of semiconductor fins while removing the second set of polysilicon sacrificial fins and filling the second set of fin openings.

21. The method according to claim 18 further comprising forming a dielectric layer between the semiconductor layer and the sacrificial layer.

22. The method according to claim 21 further comprising selectively removing underlying portions of the dielectric layer aligned with the first and second sets of polysilicon sacrificial fins when removing the first and second sets of polysilicon sacrificial fins to thereby expose respective underlying surfaces of the first and second regions.

23. The method according to claim 18 wherein filling the first set of fin openings comprises epitaxially growing a silicon-germanium bottom region and a silicon top region thereover; and wherein filling the second set of fin openings comprises epitaxially growing a silicon bottom region and a silicon-germanium region thereover.

* * * * *